US011334737B2

(12) United States Patent
Fuji (10) Patent No.: US 11,334,737 B2
(45) Date of Patent: May 17, 2022

(54) LENGTH MEASURING INSTRUMENT, CODE, AND CODE CONVERSION METHOD (71) Applicant: FUJITSU COMPONENT LIMITED, Tokyo (JP)

(72) Inventor: Koichiro Fuji, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 16/679,931

(22) Filed: Nov. 11, 2019

(65) Prior Publication Data

US 2020/0074128 A1 Mar. 5, 2020

Related U.S. Application Data (62) Division of application No. 16/177,706, filed on Nov. 1, 2018, now Pat. No. 10,803,271.

(30) Foreign Application Priority Data

Nov. 20, 2017 (JP) .............................. JP2017-222727

(51) Int. Cl.
*G06K 7/14* (2006.01)
*G06K 19/06* (2006.01)
*G01D 5/347* (2006.01)
*H03M 1/28* (2006.01)

(52) U.S. Cl.
CPC ....... *G06K 7/1404* (2013.01); *G01D 5/34715* (2013.01); *G01D 5/34792* (2013.01);
(Continued)

(58) Field of Classification Search
CPC ......................... G06K 7/1404; G01D 5/34715
(Continued)

(56) References Cited

U.S. PATENT DOCUMENTS 5,173,602 A   12/1992 Lin
5,880,683 A * 3/1999 Brandestini ........... H03M 1/285
                                                        341/10

(Continued)

FOREIGN PATENT DOCUMENTS

DE   202004008829   9/2004
EP        0560520   9/1993

(Continued)

OTHER PUBLICATIONS

DataGenetics, Gray Code, Nov. 3, 2014, DataGenetics.com/blog/november32014/index.html (Year: 2014).*

(Continued)

*Primary Examiner* — Michael G Lee
*Assistant Examiner* — David Tardif
(74) *Attorney, Agent, or Firm* — Staas & Halsey LLP (57) ABSTRACT

A length measuring instrument for measuring length with a measure includes: a measure on which a code is printed, a plurality of patterns each allotted to a different number being arranged, each of the patterns having digits to which an N-notation number (N being 3 or greater) is allotted, each of the digits having a different color corresponding to the allotted numerical value, the patterns being arranged in ascending order or descending order, a Hamming distance between patterns adjacent to each other in an array direction being 1, an amount of change in numerical value at the same digit between the adjacent patterns being 1 in the code; a reading unit that optically reads patterns printed on the measure; and a measuring unit that measures a length of a measurement target from a result of the reading by the reading unit.

2 Claims, 7 Drawing Sheets (52) U.S. Cl.
CPC ...... *G06K 19/06018* (2013.01); *H03M 1/285* (2013.01); *G01D 5/34746* (2013.01)

(58) Field of Classification Search
USPC .......................................................... 235/454
See application file for complete search history.

(56) References Cited

U.S. PATENT DOCUMENTS

| | | | |
|---|---|---|---|
| 7,445,160 B2 | 11/2008 | Ruckenstein et al. | |
| 10,504,230 B1 | 12/2019 | Stahl et al. | |
| 2006/0109579 A1* | 5/2006 | Asakura | G11B 5/743 360/49 |
| 2012/0026321 A1 | 2/2012 | Hasler et al. | |

FOREIGN PATENT DOCUMENTS

| | | |
|---|---|---|
| EP | 0 635 700 A1 | 1/1995 |
| JP | 5272916 | 10/1993 |
| JP | 7-35535 | 2/1995 |
| JP | 7-167675 | 7/1995 |
| JP | 7-294238 | 11/1995 |
| JP | 200975013 | 4/2009 |
| JP | 2012-63344 | 3/2012 |
| WO | WO9630217 | 10/1996 |

OTHER PUBLICATIONS

Japanese Platform for Patent Information English abstract corresponding to Japanese Patent Publication No. 7-35535, published Feb. 7, 1995.
Japanese Platform for Patent Information English abstract corresponding to Japanese Patent Publication No. 2012-63344, published Mar. 29, 2012.
Japanese Platform for Patent Information English abstract corresponding to Japanese Patent Publication No. 7-294238, published Nov. 10, 1995.
Japanese Platform for Patent Information English abstract corresponding to Japanese Patent Publication No. 7-167675, published Jul. 4, 1995.
Office Action for U.S. Appl. No. 16/177,706, dated Oct. 3, 2019.
U.S. Appl. No. 16/177,706, filed Nov. 1, 2018, Koichiro Fuji, Fujitsu Component Limited.
U.S. Appl. No. 17/089,054, filed Nov. 4, 2020, Koichiro Fuji, Fujitsu Component Limited.
M.C. ER: "On Generating the N-ary Reflected Gray Codes," IEEE Transactions on Computers, vol. C-33, No. 8, Aug. 1984, pp. 739-741.
Extended European Search Report, dated Oct. 21, 2019, in European Application No. 19174201.4 (14 pp.).
Office Action, dated May 21, 2020, in U.S. Appl. No. 16/414,108 (5 pp.).
U.S. Appl. No. 16/414,108, filed May 16, 2019, Koichiro Fuji, Fujitsu Component Limited.
Office Action, dated Jan. 24, 2020, in U.S. Appl. No. 16/177,706 (11 pp.).
Notice of Allowance, dated May 18, 2020, in U.S. Appl. No. 16/177,706 (10 pp.).
Notice of Allowance, dated Aug. 5, 2020, in U.S. Appl. No. 16/414,108 (37 pp.).

* cited by examiner

| \multicolumn{6}{c}{DIGIT NUMBER} |
|---|---|---|---|---|---|
| 1 | 2 | 3 | 4 | 5 | 6 |
| 0 | 0 | 0 | 0 | 0 | 0 |
| 0 | 0 | 0 | 0 | 0 | 1 |
| 0 | 0 | 0 | 0 | 0 | 2 |
| 0 | 0 | 0 | 0 | 1 | 0 |
| 0 | 0 | 0 | 0 | 1 | 1 |
| 0 | 0 | 0 | 0 | 1 | 2 |
| 0 | 0 | 0 | 0 | 2 | 0 |
| 0 | 0 | 0 | 0 | 2 | 1 |
| 0 | 0 | 0 | 0 | 2 | 2 |
| 0 | 0 | 0 | 1 | 0 | 0 |
| 0 | 0 | 0 | 1 | 0 | 1 |
| 0 | 0 | 0 | 1 | 0 | 2 |
| 0 | 0 | 0 | 1 | 1 | 0 |
| 0 | 0 | 0 | 1 | 1 | 1 |
| 0 | 0 | 0 | 1 | 1 | 2 |
| 0 | 0 | 0 | 1 | 2 | 0 |
| 0 | 0 | 0 | 1 | 2 | 1 |
| 0 | 0 | 0 | 1 | 2 | 2 |

Rows highlighted: 23 (0,2 / 1,0), 24 (1,2 / 2,0), 25 (0,2,2 / 1,0,0)

| \multicolumn{6}{c}{DIGIT NUMBER} |
|---|---|---|---|---|---|
| 1 | 2 | 3 | 4 | 5 | 6 |
| 0 | 0 | 0 | 0 | 0 | 0 |
| 0 | 0 | 0 | 0 | 0 | 1 |
| 0 | 0 | 0 | 0 | 0 | 2 |
| 0 | 0 | 0 | 0 | 1 | 2 |
| 0 | 0 | 0 | 0 | 1 | 0 |
| 0 | 0 | 0 | 0 | 1 | 1 |
| 0 | 0 | 0 | 0 | 2 | 1 |
| 0 | 0 | 0 | 0 | 2 | 2 |
| 0 | 0 | 0 | 0 | 2 | 0 |
| 0 | 0 | 0 | 1 | 2 | 0 |
| 0 | 0 | 0 | 1 | 2 | 1 |
| 0 | 0 | 0 | 1 | 2 | 2 |
| 0 | 0 | 0 | 1 | 0 | 2 |
| 0 | 0 | 0 | 1 | 0 | 0 |
| 0 | 0 | 0 | 1 | 0 | 1 |
| 0 | 0 | 0 | 1 | 1 | 1 |
| 0 | 0 | 0 | 1 | 1 | 2 |
| 0 | 0 | 0 | 1 | 1 | 0 |

☐ = WHITE
▨ = BLUE
▦ = BLACK

| \multicolumn{6}{c}{13} |
|---|---|---|---|---|---|
| \multicolumn{6}{c}{DIGIT NUMBER} |
| 1 | 2 | 3 | 4 | 5 | 6 |
| 0 | 0 | 0 | 0 | 0 | 0 |
| 0 | 0 | 0 | 0 | 0 | 1 |
| 0 | 0 | 0 | 0 | 0 | 2 |
| 0 | 0 | 0 | 0 | 1 | 2 |
| 0 | 0 | 0 | 0 | 1 | 1 |
| 0 | 0 | 0 | 0 | 1 | 0 |
| 0 | 0 | 0 | 0 | 2 | 0 |
| 0 | 0 | 0 | 0 | 2 | 1 |
| 0 | 0 | 0 | 0 | 2 | 2 |
| 0 | 0 | 0 | 1 | 2 | 2 |
| 0 | 0 | 0 | 1 | 2 | 1 |
| 0 | 0 | 0 | 1 | 2 | 0 |
| 0 | 0 | 0 | 1 | 1 | 0 |
| 0 | 0 | 0 | 1 | 1 | 1 |
| 0 | 0 | 0 | 1 | 1 | 2 |
| 0 | 0 | 0 | 1 | 0 | 2 |
| 0 | 0 | 0 | 1 | 0 | 1 |
| 0 | 0 | 0 | 1 | 0 | 0 |

☐ = WHITE  
▨ = BLUE  
▦ = BLACK

LENGTH MEASURING INSTRUMENT, CODE, AND CODE CONVERSION METHOD

CROSS-REFERENCE TO RELATED APPLICATION

This application is a divisional patent application of U.S. patent application Ser. No. 16/177,706 filed Nov. 1, 2018, which claims the foreign priority benefit under 35 U.S.C. § 119 of Japanese Patent Application No. 2017-222727 filed on Nov. 20, 2017, the entire contents of which are incorporated herein by reference.

FIELD

A certain aspect of the embodiments is related to a length measuring instrument, a code, and a code conversion method.

BACKGROUND

In a case where new clothes are made, or clothes are altered at a clothing store, a store clerk normally takes the size with a measure. A store clerk manually writes down measurement data on a size memo for each customer, and after that, manually inputs the measurement data to a terminal or the like of the store. In this case, the task of writing down measurement data onto the size memos and the task of inputting the measurement data to the terminal are required, resulting in unnecessary duplication of effort.

To solve this problem, there is a known device that is capable of inputting measurement data to a terminal without any size memos (see Japanese Patent Application Laid-Open No. 7-35535, for example). This device includes: a transmitter equipped with a measure that measures the sizes of respective portion of the measurement target (a person or an object) and a measure that has a function of transmitting the measurement data; and a measure signal receiver/recorder that receives signals transmitted from the transmitter, and prints the measurement data. The transmitter optically reads, with a reader, binary codes formed with white dots and black dots attached onto a measure, decodes the read data, and transmits the decoded data to the receiver/recorder.

SUMMARY

According to an aspect of the present invention, there is provided A length measuring instrument for measuring length with a measure, the length measuring instrument including: a measure on which a code is printed, a plurality of patterns each allotted to a different number being arranged, each of the patterns having digits to which an N-notation number (N being 3 or greater) is allotted, each of the digits having a different color corresponding to the allotted numerical value, the patterns being arranged in ascending order or descending order, a Hamming distance between patterns adjacent to each other in an array direction being 1, an amount of change in numerical value at the same digit between the adjacent patterns being 1 in the code; a reading unit that optically reads patterns printed on the measure; and a measuring unit that measures a length of a measurement target from a result of the reading by the reading unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a case where binary codes are used, as the measurement target becomes longer, the number of digits of the binary codes becomes larger. Therefore, in a case where binary codes with a large number of digits are attached onto a measure, the measure needs to be large in width. Also, to read binary codes having a large number of digits, it is necessary to increase the number of read sensors in the reader. Therefore, an increase in the size of the transmitter is unavoidable.

The following is a description of an embodiment of the present invention, with reference to the drawings.

Figure 1:
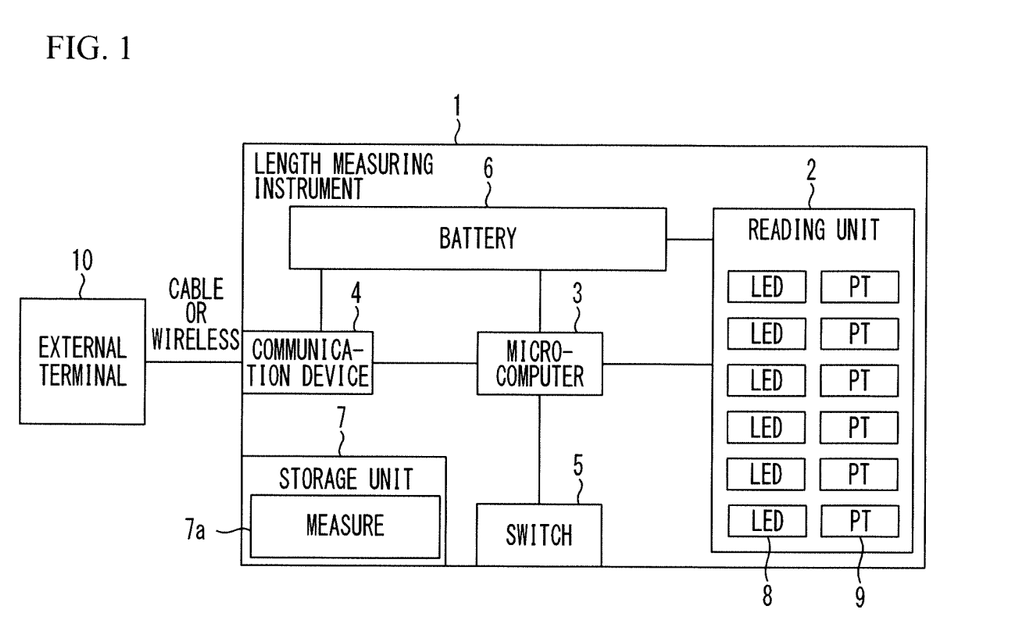
FIG. 1 is a configuration diagram of a length measuring instrument according to this embodiment.

FIG. 1 is a configuration diagram of a length measuring instrument according to this embodiment.

A length measuring instrument (hereinafter referred to as "measuring instrument") 1 includes: a reading unit 2 that reads a color pattern of a measure 7a having a multidigit color pattern attached thereto; a microcomputer 3 as a measurement unit that measures the length of the measurement target from the data read by the reading unit 2; a communication device 4 that transmits the data of the calculated length of the measurement target to an external terminal 10 in a wired or wireless manner; a switch 5 that instructs the microcomputer 3 to start measurement; a battery 6 that supplies electric power to the reading unit 2, the microcomputer 3, and the communication device 4; and a storage unit 7 that stores the measure 7a. Although the measure 7a is stored within the storage unit 7 in FIG. 1, a measure might not be stored inside of the measuring instrument 1, but may be externally attached to the measuring instrument 1 at the time of measuring.

The reading unit 2 includes light emitting diodes (LEDs) 8 that emit light onto the color pattern, and phototransistors (PTs) 9 that receive light reflected from the color pattern and convert the amounts of received light into current values or voltage values. The LEDs 8 emits infrared light, visible light, and/or ultraviolet light, and the PTs 9 receive the infrared light, the visible light, and/or the ultraviolet light reflected from the color pattern. In this embodiment, the number of the LEDs 8 and the number of the PTs 9 are the same as the number of the digits of the color pattern. Although six sets of the LEDs 8 and the PTs 9 are shown in FIG. 1, the number of sets is not necessarily six. Also, in this embodiment, the LEDs 8 are used as the light emitting unit, and the PTs 9 are used as the light receiving unit. However, light emitting elements other than LEDs and light receiving elements other than PTs may be used.

The microcomputer 3 controls switching on/off of the LEDs 8, and reads the current values or the voltage values of signal output from the PTs 9. The reflectance varies depending on the colors of the color pattern, and the amounts of light to be received by the PTs 9 vary with the reflectance. Accordingly, the microcomputer 3 can determine colors from the current values or the voltage values output from the PTs 9. For example, in a case where a voltage value that is output from the PT 9 is 2.0 V, 1.5 V, or 1.0 V, the microcomputer 3 determines the color of the color pattern to be white, blue, or black, respectively.

A scale is printed in the length direction on the front surface of the measure 7a. For example, a color pattern with codes generated by modifying N-notation gray codes using N (N≥3, which is the same in the description below) colors is printed at regular intervals on the back surface. The codes generated by modifying N-notation gray codes will be described later. At each digit of the color pattern, instead of N different colors, the same color having N or more different densities or gradations may be used, for example. However, such different densities are also regarded as "different colors" in this specification. The storage unit 7 is attached to the housing of the measuring instrument 1, and can be detached from the housing of the measuring instrument 1.

The external terminal 10 is a communication terminal that has a cable or wireless communication function, such as a computer or a smartphone. The external terminal 10 receives the data of the length of the measurement target from the communication device 4, and registers and manages the data in a database. The database in which the data of the length of the measurement target is registered may be installed in the external terminal 10, or may be provided outside the external terminal 10 in an accessible state.

Figure 2:
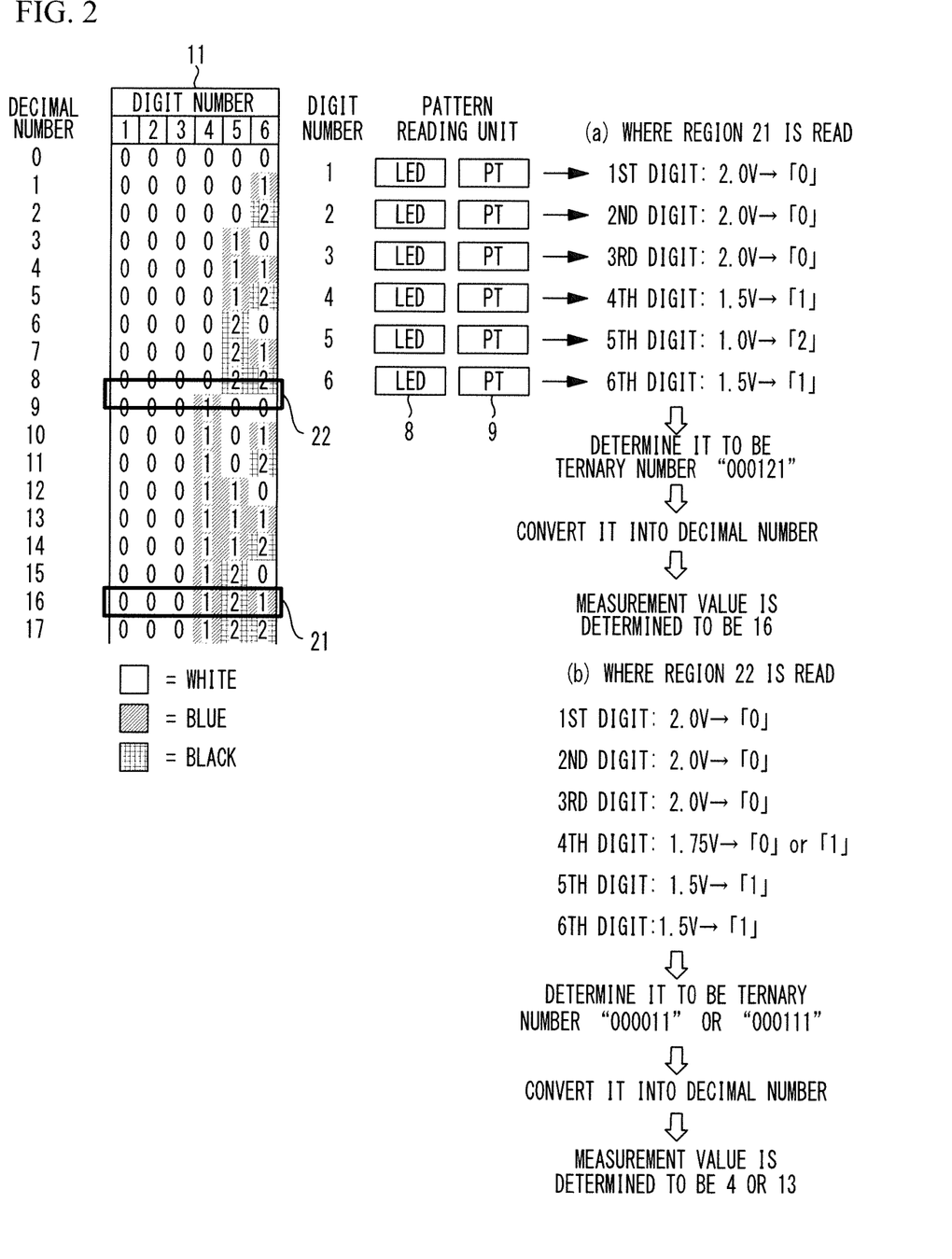
FIG. 2 is a diagram showing a process of reading a ternary color pattern.

FIG. 2 is a diagram showing a process of reading a ternary color pattern.

A ternary color pattern 11 is formed with six digits, for example, and the three colors of white, blue, and black are adopted as the colors corresponding to 0, 1, and 2 of ternary numbers. The reflectance becomes lower in the order of white, blue, and black. For ease of explanation, the numerical values of ternary numbers and the digit numbers corresponding to the respective colors are shown in FIG. 2. However, the numerical values of ternary numbers and the digit numbers are not shown in color patterns in practice. Further, the voltage values to be output from the PTs 9 are analog data. In a case where white, blue, and black are read, the voltage values to be output from the PTs 9 are 2.0 V, 1.5 V, and 1.0 V, respectively.

One set of the LED 8 and the PT 9 is assigned for reading the pattern of one digit of the color pattern 11.

When a region 21 of the color pattern 11 is read, the PTs 9 corresponding to digit number 1 through digit number 3 of white output 2.0 V, the PTs 9 corresponding to digit number 4 and digit number 6 of blue output 1.5 V, and the PT 9 corresponding to digit number 5 of black outputs 1.0 V. The microcomputer 3 determines the colors at the respective digits from the voltage values supplied from the respective PTs 9, and converts the colors into a corresponding ternary number "000121". In the example shown in FIG. 2, the pattern in the region 21 is converted into the ternary number "000121". The microcomputer 3 calculates the length of the measurement target by converting the ternary number "000121" into a decimal number. In the region 21, the ternary number "000121" is converted to a decimal number "16". In FIG. 2, the numerical value obtained as a result of reading of the region 21 coincides with the numerical value allotted to the region 21.

On the other hand, a region 22 in the color pattern 11 exists over two rows. Therefore, when the region 22 is read, the PTs 9 corresponding to digit number 1 through digit number 3 in both rows output 2.0 V. However, the PT 9 corresponding to digit number 4, at which one row is white while the other row is blue, might output 1.75V, which is an average of 1.5V and 2.0V, and the PTs 9 corresponding to digit number 5 and digit number 6, at which one row is write while the other row is black, might output 1.5 V, which is an average of 2.0V and 1.0V. As the voltage values to be output from the PTs 9 are analog data, in a case where a boundary in the color pattern 11 is read, the intermediate values between the colors of the adjacent upper and lower patterns are measured. Note that the output voltage of the PT 9 corresponding to digit number 4 might be a value other than 1.75V, but could be any value between 1.5V and 2.0V, depending on a condition where the region 22 is read. The same might be applied to output voltages of the PTs 9 corresponding to digit numbers 5 and 6.

In accordance with the voltage values from the respective PTs 9, the microcomputer 3 converts the pattern in the region 22 into a ternary number "000011" or "000111", and converts this value into a decimal number, to calculate the length of the measurement target. However, the decimal number "4" or "13", which is converted from the ternary number "000011" or "000111", is not the same as the decimal number "8" or "9" corresponding to the position of the region 22. Therefore, the length of the measurement target calculated by the microcomputer 3 does not match the actual length, and thus, a read error occurs. Because such a read error will occur at a boundary in the color pattern 11, the measuring instrument 1 cannot use the color pattern 11 shown in FIG. 2.

Figure 3A:
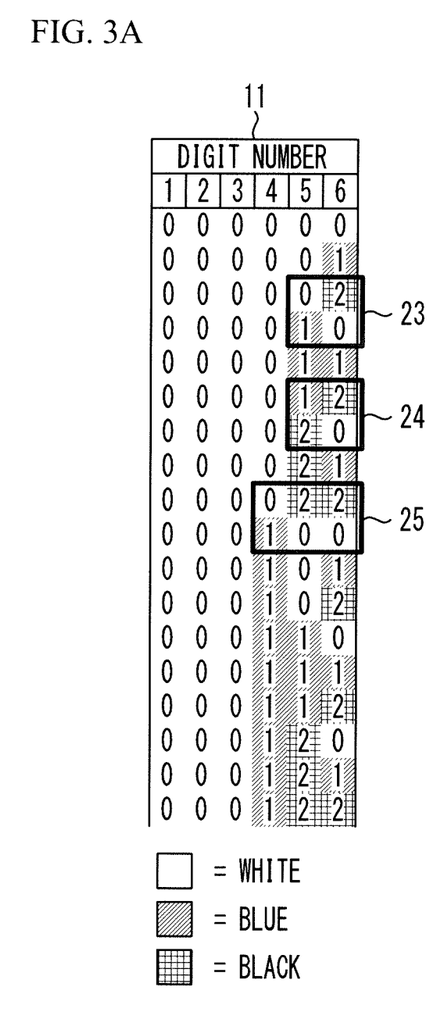
FIG. 3A is a diagram showing an example of a ternary color pattern.
Figure 3B:
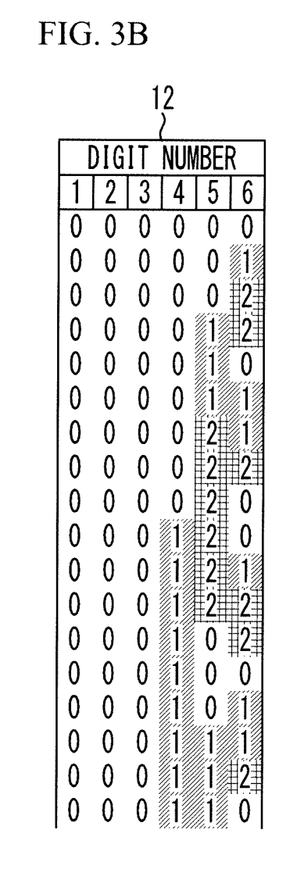
FIG. 3B is a diagram showing an example of a color pattern formed with ternary gray codes.

FIG. 3(A) is a diagram showing an example of the ternary color pattern 11. FIG. 3(B) is a diagram showing an example of a color pattern 12 formed with ternary gray codes.

As described above, the intermediate values between the adjacent upper and lower patterns at a boundary in a color pattern are measured. Therefore, in a case where the color pattern shown in FIG. 3(A) is used, an error might occur between the actual length of the measurement target and the length of the measurement target calculated by the microcomputer 3.

One of the reasons of such an error is that color changes (numerical value changes) occur at more than one digit in upper and lower patterns adjacent to each other, as shown in regions 23 through 25 in FIG. 3(A). For example, in the regions 23 and 24, color changes have occurred at two digits, digit number 5 and digit number 6. In the region 25, color changes have occurred at three digits, digit number 4 through digit number 6.

To avoid error occurrences, the color pattern 12 formed with ternary gray codes as shown in FIG. 3(B) may be adopted. In the color pattern 12, a color change occurs only at one digit in upper and lower patterns adjacent to each other.

Figure 4:
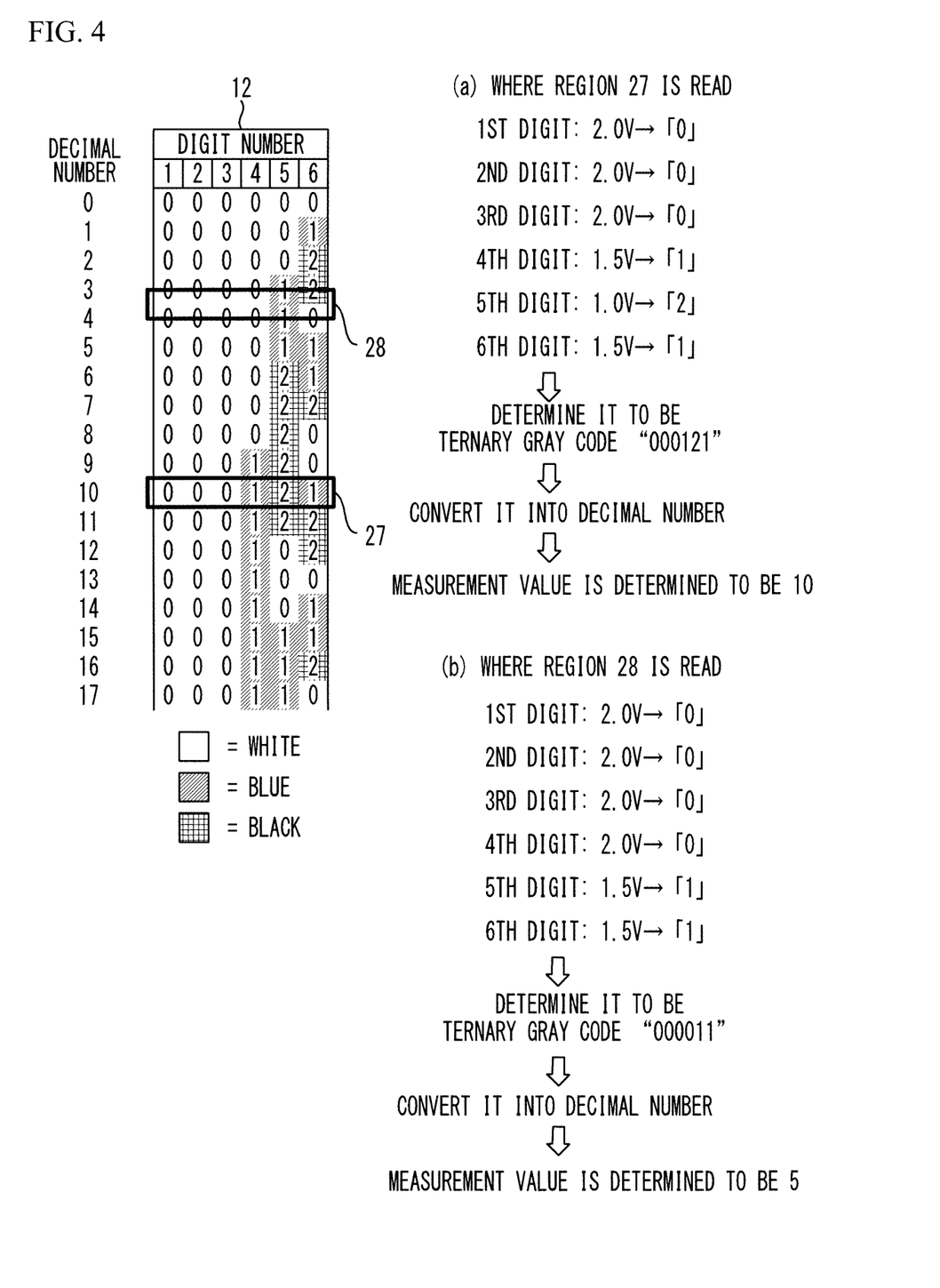
FIG. 4 is a diagram showing a process of reading a color pattern formed with ternary gray codes.

FIG. 4 is a diagram showing a process of reading the color pattern 12 formed with ternary gray codes.

When a region 27 in the color pattern 12 is read, the PTs 9 corresponding to digit number 1 through digit number 3 of white output 2.0 V, the PTs 9 corresponding to digit number 4 and digit number 6 of blue output 1.5 V, and the PT 9 corresponding to digit number 5 of black outputs 1.0 V. The microcomputer 3 determines the colors of the respective digits from the voltage values supplied from the respective PTs 9, and converts the colors into a corresponding ternary gray code. In the example shown in FIG. 4, a ternary gray code "000121" is obtained from the pattern in the region 27. The microcomputer 3 calculates the length of the measurement target by converting the ternary gray code "000121" into a decimal number. Note that known methods are used as a method of converting a ternary gray code into a ternary number, and as a method of converting a ternary number into a decimal number. In the region 27, the ternary gray code "00012" is converted to a decimal number "10". The position of the region 27 in the color pattern 12 corresponds to the decimal number "10". Accordingly, the length of the measurement target calculated by the microcomputer 3 coincides with the length indicated by the measure 7a, and the accuracy of reading is high.

On the other hand, when a region 28 in the color pattern 12 is read, each of the PTs 9 corresponding to digit number 1 through digit number 4, at which the upper and lower patterns are white, outputs 2.0 V, and the PTs 9 corresponding to digit number 5, at which the upper and lower rows are blue, and digit number 6, at which one row is black while the other row is white, output 1.5 V. In the example shown in FIG. 4, the ternary gray code corresponding to the pattern in the region 28 is "000011". The microcomputer 3 calculates the length of the measurement target by converting the ternary gray code "000011" into a decimal number. The ternary gray code "000011" of the region 28 is converted into a decimal number "5". Since the position of the region 28 in the color pattern 12 corresponds to a decimal number "3" or "4", and therefore, does not coincide with the decimal number calculated by the microcomputer 3. Because of this, the measuring instrument 1 cannot use the color pattern 12, either.

The reason that an error still occurs when the color pattern 12 is used is that there are cases where a value change by "2" might occur at each digit of upper and lower patterns adjacent to a boundary in the color pattern 12. A value change by "2" means that the difference in the numerical value at the same digit between upper and lower patterns is 2 or larger, or that there is a change from white to black or from black to white in the color pattern 12 shown in FIG. 4.

At digit number 6 in the region 28 in the color pattern 12, the upper pattern adjacent to the boundary is black (2), and the lower pattern is white (0). In this case, the PT 9 corresponding to digit number 6 may output 1.5 V, an average of 1.0V and 2.0V. However, this is the same as the value output from the PT 9 in a case where blue is read, and therefore, the microcomputer 3 determines the color of digit number 6 to be blue. As a result, an error occurs between the actual length of the measurement target and the length of the measurement target calculated by the microcomputer 3.

If the numerical value changes between adjacent upper and lower patterns in the color pattern 12 are value changes by "1", no such errors will occur. A value change by "1" means that the difference in the numerical value at the same digit between upper and lower patterns is "1", or that there is a change from white to blue or from blue to white, or a change from blue to black or from black to blue in the color pattern 12 shown in FIG. 4.

Figure 5:
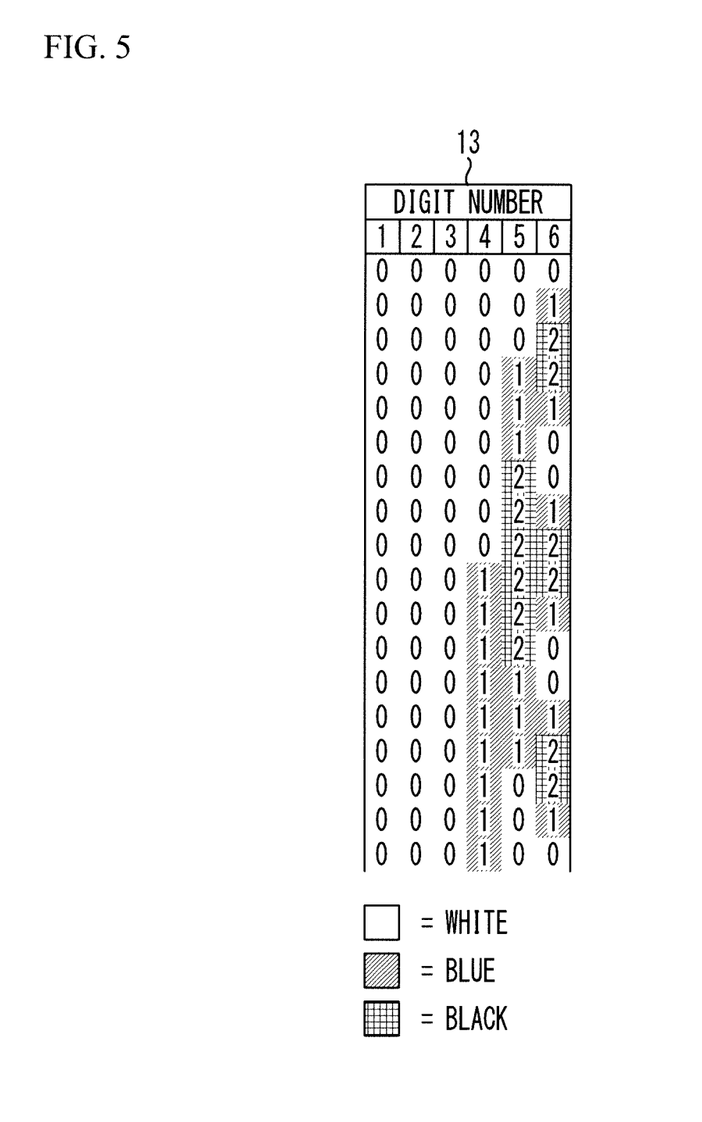
FIG. 5 is a diagram showing an example of a color pattern of codes generated by modifying ternary gray codes using three colors.

FIG. 5 is a diagram showing an example of a color pattern 13 of codes generated by modifying ternary gray codes using three colors according to an embodiment of the present invention.

In the color pattern 13, a color change or a numerical value change between upper and lower patterns adjacent to each other occurs only at one digit, and the numerical value change between two adjacent patterns is a value change by "1". Accordingly, the color pattern 13 is compatible with ternary gray codes that do not have any value change by "2". In other words, patterns each allotted to a different number are arranged in the color pattern 13, and each of the patterns has digits to which numerical values of N-notation numbers (N being 3 or greater) are allotted. Each of the digits has a different color corresponding to the numerical value allotted thereto. The patterns are arranged in ascending order or descending order. The Hamming distance between patterns adjacent to each other in the array direction is "1", and the amount of change in the numerical value at the same digit between adjacent patterns is "1".

As the color pattern 13 is used, even when a boundary between adjacent upper and lower patterns is read, and intermediate voltage values between the adjacent upper and lower patterns are output from the PTs 9, the microcomputer 3 can convert the voltage values into a decimal number corresponding to one of the upper and lower patterns. As a result, any substantial error will not occur between the actual length of the measurement target and the length of the measurement target calculated by the microcomputer 3.

Figure 6:
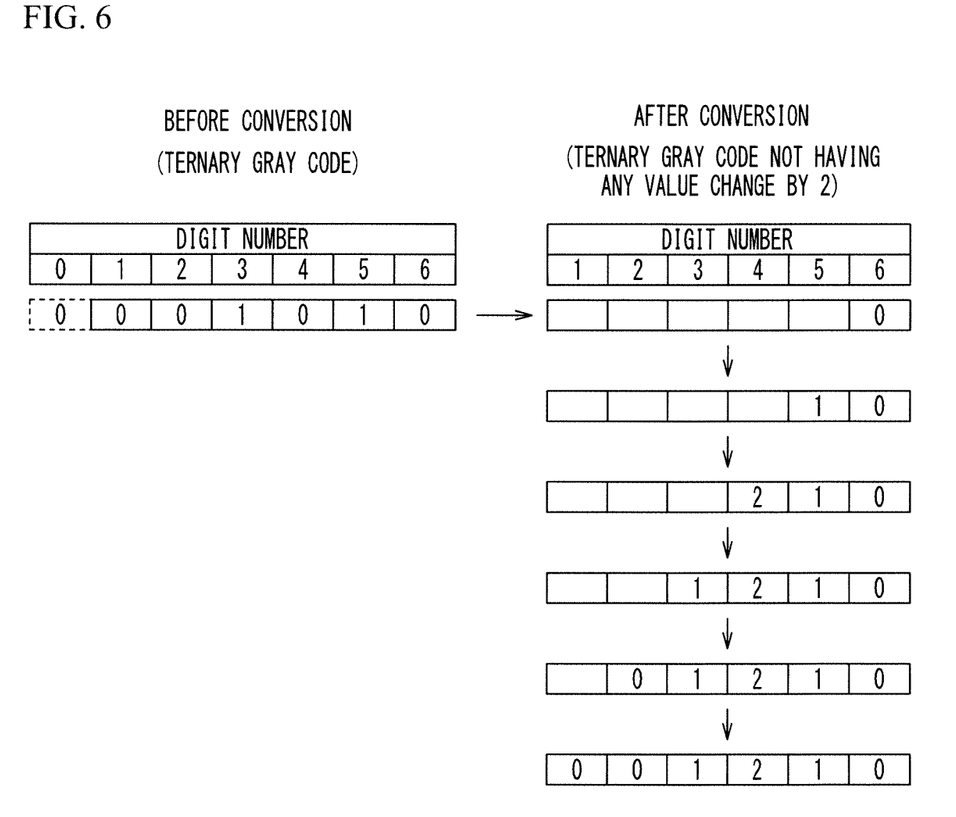
FIG. 6 is a diagram showing a method of creasing a ternary gray code that does not have any value change by "2", from a ternary gray code.

FIG. 6 is a diagram showing a method of creating a ternary gray code that does not have any value change by "2", from a ternary gray code. Although not shown in the drawings, the operation for creating the ternary gray code described below may be processed with a known information processing device such as a computer equipped with a processing unit such as CPU, with software stored in a storage unit within the information processing device or software externally downloaded into the information processing device.

The conversion rules for creating a ternary gray code that does not have any value change by "2" from a ternary gray code are as follows.
1) In a case where the sum of the numerical values at the digits higher than the digit of the conversion target is 0 or an even number, the numerical value at the digit of the conversion target is maintained as it is.
2) In a case where the sum of the numerical values at the digits higher than the digit of the conversion target is an odd number, and the numerical value at the digit of the conversion target is "1", the numerical value at the digit of the conversion target is maintained as it is.
3) In a case where the sum of the numerical values at the digits higher than the digit of the conversion target is an odd number, and the numerical value at the digit of the conversion target is "2", the numerical value at the digit of the conversion target is converted to "0".
4) In a case where the sum of the numerical values at the digits higher than the digit of the conversion target is an odd number, and the numerical value at the digit of the conversion target is "0", the numerical value at the digit of the conversion target is converted to "2".

Note that digit number 1 is the highest-order digit, and digit number 6 is the lowest-order digit. Further, there is a digit with digit number 0 in a ternary gray code prior to conversion, but the digit with digit number 0 is a digit set for convenience sake in a process of converting the numerical value at digit number 1, and "0" is set as a fixed value at the digit with digit number 0.

As an example, a method of creating a ternary gray code that does not have any value change by "2" from a ternary gray code "001010" shown in FIG. 6 is described.

First, conversion of "0" at digit number 6 is considered prior to conversion.

Since the sum of the numerical values at digit number 0 through digit number 5, which are higher than digit number 6, is 2 (an even number), "0" at digit number 6 is maintained in accordance with the above conversion rule (1). Next, the sum of the numerical values at digit number 0 through digit number 4, which are higher than digit number 5, is 1 (an odd number), and the numerical value at digit number 5 is "1", prior to conversion. Therefore, "1" at digit number 5 is maintained in accordance with the above conversion rule (2).

Next, the sum of the numerical values at digit numbers 0 through 3, which are higher than digit number 4, is 1 (an odd number), and the numerical value at digit number 4 is "0", prior to conversion. Therefore, "0" at digit number 4 is converted to "2" in accordance with the above conversion rule (4). Next, the sum of the numerical values at digit numbers 0 through 2, which are higher than digit number 3, is 0 prior to conversion, and therefore, "1" at digit number 3 is maintained in accordance with the above conversion rule (1).

The sum of the numerical values at digit numbers 0 and 1, which are higher than digit number 2, is 0 prior to conversion, and therefore, "0" at digit number 2 is maintained in accordance with the above conversion rule (1). Lastly, the numerical value at digit number 0, which is higher than digit number 1, is 0 prior to conversion, "0" at digit number 1 is maintained in accordance with the above conversion rule (1).

Through such procedures, "001010" shown in FIG. 6 is converted to a ternary gray code "001210", which does not have any value change by "2".

Note that it is also possible to perform reverse conversion to convert a ternary gray code that does not have any value change by "2" into the original ternary gray code, in accordance with the above conversion rules (1) through (4).

As described above, conversion rules compatible with N-notation gray codes are determined, so that an N-notation gray code that does not have any value change by "2" can be created from a N-notation gray node.

Figure 7:
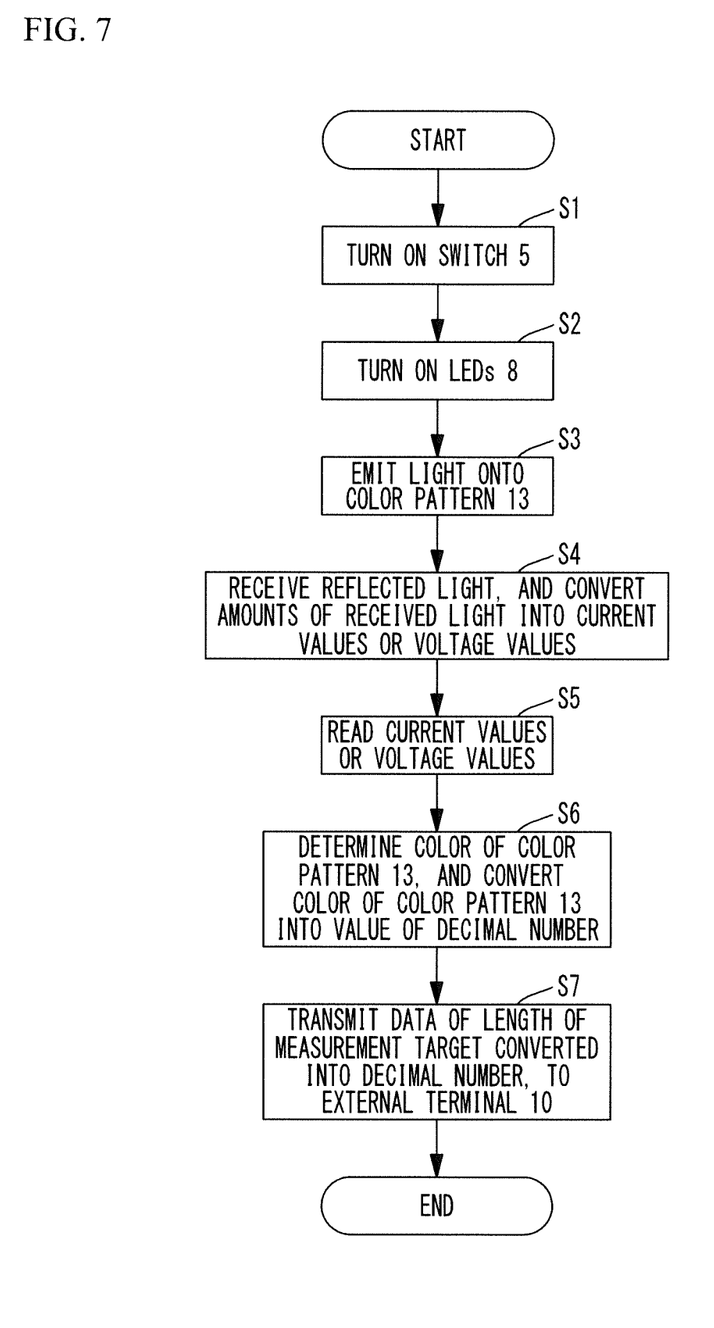
FIG. 7 is a flowchart showing a processing operation to be performed by the measuring instrument.

FIG. 7 is a flowchart showing a processing operation to be performed by the measuring instrument 1.

First, when the switch 5 is pressed, the microcomputer 3 is instructed to start measurement (S1). The microcomputer 3 turns on the respective LEDs 8 (S2), and the LEDs 8 emit light onto the color pattern 13 (S3). The respective PTs 9 receive light reflected from the color pattern 13, and convert the amounts of received light into current values or voltage values (S4). The microcomputer 3 reads the current values or voltage values of the respective PTs 9 (S5).

From the current values or voltage values output from the respective PTs 9, the microcomputer 3 determines the color of the color pattern 13 represented by a N-notation gray code that does not have any value change by "2", calculates the value of the N-notation gray code from the color pattern 13 in accordance with the conversion rules compatible with N-notation gray codes, and further converts the N-notation numerical value into a value of a decimal number in accordance with a known conversion method (S6). The microcomputer 3 may include a table that is prepared in advance and shows the correspondence relationship between colors in the color pattern 13 and the values of decimal numbers. The microcomputer 3 may calculate the value of a decimal number in accordance with this table. The microcomputer 3 then transmits the data of the length of the measurement target converted into a decimal number, to the external terminal 10 via the communication device 4 (S7), and ends this process.

As described above, according to this embodiment, the measuring instrument 1 includes: the measure 7a on which a code is printed, patterns each allotted to a different number being arranged, each of the patterns having digits to which an N-notation number (N being 3 or greater) is allotted, each of the digits having a different color corresponding to the allotted numerical value, the patterns being arranged in ascending order or descending order, the Hamming distance between patterns adjacent to each other in the array direction being 1, the amount of change in the numerical value at the same digit between adjacent patterns being 1 in the code; the reading unit 2 that optically reads the patterns; and the microcomputer 3 that measures the length of a measurement target from the result of the reading by the reading unit 2.

As described above, the patterns are N-notation numbers (N being 3 or greater). Accordingly, the number of digits constituting each pattern can be made smaller, and the width of the measure 7a can be made smaller than that in a case where binary codes are attached onto a measure. Further, the number of read sensors for reading patterns having a large number of digits, or the number of LEDs 8 and PTs 9, can be reduced. Thus, the device can be made smaller in size.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A code conversion method for converting a first ternary gray code into a second ternary gray code, the code conversion method comprising:

reading by a length measuring instrument a conversion target by emitting light onto the conversion target and receiving light reflected by the conversion target;

setting, by the length measuring instrument, a digit of the conversion target, starting from the lowest-order digit of the first ternary gray code;

when a sum of numerical values at digits higher than the digit of the conversion target is 0 or an even number, or when the sum of the numerical values at digits higher than the digit of the conversion target is an odd number while a numerical value at the digit of the conversion target is 1, maintaining, by the length measuring instrument, the numerical value at the digit of the conversion target;

when the sum of the numerical values at digits higher than the digit of the conversion target is an odd number while the numerical value at the digit of the conversion target is 0, converting, by the length measuring instrument, the numerical value at the digit of the conversion target to 2;

when the sum of the numerical values at digits higher than the digit of the conversion target is an odd number while the numerical value at the digit of the conversion target is 2, converting, by the length measuring instrument, the numerical value at the digit of the conversion target to 0;

converting, by the length measuring instrument, the first ternary gray code into the second ternary gray code based on the maintained numerical value or the converted numerical value at the digit of the conversion target; and transmitting, by the length measuring instrument, data corresponding to the second ternary gray code to an external device.

2. The code conversion method as claimed in claim 1, wherein the length measuring instrument measures a length of a measurement target based on the second ternary gray code converted using the code conversion method.

* * * * *